(12) United States Patent
McPherson et al.

(10) Patent No.: US 10,136,529 B2
(45) Date of Patent: *Nov. 20, 2018

(54) LOW PROFILE, HIGHLY CONFIGURABLE, CURRENT SHARING PARALLELED WIDE BAND GAP POWER DEVICE POWER MODULE

(71) Applicant: Cree Fayetteville, Inc., Fayetteville, AR (US)

(72) Inventors: Brice McPherson, Fayetteville, AR (US); Peter Killeen, Fayetteville, AR (US); Alex Lostetter, Fayetteville, AR (US); Robert Shaw, Fayetteville, AR (US); Brandon Passmore, Fayetteville, AR (US); Jared Hornberger, Fayetteville, AR (US); Tony M. Berry, Springdale, AR (US)

(73) Assignee: Cree Fayetteville, Inc., Fayetteville, AR (US)

( * ) Notice: Subject to any disclaimer, the term of this patent is extended or adjusted under 35 U.S.C. 154(b) by 0 days.

This patent is subject to a terminal disclaimer.

(21) Appl. No.: 15/236,844

(22) Filed: Aug. 15, 2016

(65) Prior Publication Data

US 2016/0353590 A1 Dec. 1, 2016

Related U.S. Application Data

(63) Continuation of application No. 14/609,629, filed on Jan. 30, 2015, now Pat. No. 9,426,883.

(60) Provisional application No. 61/933,535, filed on Jan. 30, 2014.

(51) Int. Cl.
*H05K 5/00* (2006.01)
*H05K 1/02* (2006.01)
(Continued)

(52) U.S. Cl.
CPC ....... *H05K 5/0069* (2013.01); *H01L 21/4817* (2013.01); *H01L 23/049* (2013.01);
(Continued)

(58) Field of Classification Search
USPC .......................................................... 361/743
See application file for complete search history.

(56) References Cited

U.S. PATENT DOCUMENTS 5,038,197 A 8/1991 Satriano
6,307,755 B1 10/2001 Williams et al.
(Continued)

FOREIGN PATENT DOCUMENTS

EP 2 284 889 A1 2/2011
JP 62-202548 A 9/1987
(Continued)

OTHER PUBLICATIONS

Ulrich et al., "Advanced Electronic Packaging," New Jersey: John Wiley & Sons, Inc., 2006, pp. 203.
(Continued)

*Primary Examiner* — Andargie M Aychillhum
(74) *Attorney, Agent, or Firm* — Baker & Hostetler LLP

(57) ABSTRACT

A method of making a power module includes providing a base plate defining a topology pattern, providing a power substrate above the base plate, providing at least two power contacts and arranging solder catches in the at least two power contacts, soldering the at least two power contacts to the power substrate utilizing the solder catches, and securing a housing to the power substrate.

28 Claims, 19 Drawing Sheets

(51) Int. Cl.
*H01L 23/373* (2006.01)
*H01L 25/07* (2006.01)
*H01L 23/049* (2006.01)
*H01L 21/48* (2006.01)
*H01L 23/367* (2006.01)
*H05K 5/02* (2006.01)
*H05K 7/20* (2006.01)
*H01L 23/15* (2006.01)
*H01L 23/498* (2006.01)

(52) U.S. Cl.
CPC ...... *H01L 23/3675* (2013.01); *H01L 23/3735* (2013.01); *H01L 25/07* (2013.01); *H01L 25/072* (2013.01); *H05K 1/0296* (2013.01); *H05K 5/0013* (2013.01); *H05K 5/0091* (2013.01); *H05K 5/0247* (2013.01); *H05K 7/20509* (2013.01); *H01L 23/15* (2013.01); *H01L 23/49838* (2013.01); *H01L 23/49861* (2013.01); *H01L 2924/0002* (2013.01)

(56) References Cited

U.S. PATENT DOCUMENTS

| | | | |
|---|---|---|---|
| 7,687,903 B2 | 3/2010 | Son et al. | |
| 7,789,486 B2 | 9/2010 | Silverbrook et al. | |
| 8,018,056 B2 | 9/2011 | Hauenstein | |
| 8,368,210 B2 | 2/2013 | Hauenstein | |
| 9,407,251 B1 * | 8/2016 | Passmore | H05K 1/0243 |
| 2006/0133055 A1 | 6/2006 | Uematsu et al. | |
| 2013/0010446 A1 | 1/2013 | Henrik et al. | |
| 2014/0346659 A1 | 11/2014 | Nakamura et al. | |
| 2014/0367736 A1 | 12/2014 | Iizuka et al. | |

FOREIGN PATENT DOCUMENTS

| | | |
|---|---|---|
| JP | 63-110742 A | 5/1988 |
| JP | 10-256411 A | 9/1998 |
| JP | 11-74433 A | 3/1999 |
| JP | 2001185678 A | 7/2001 |
| JP | 2002518858 A | 6/2002 |
| JP | 2004349300 A | 12/2004 |
| JP | 201080931 A | 4/2010 |
| JP | 2010093033 A | 4/2010 |
| WO | 02/082541 A1 | 10/2002 |
| WO | 2013/146212 A1 | 10/2013 |
| WO | 2013145619 A1 | 10/2013 |

OTHER PUBLICATIONS

Shengnan, "Packaging Design of IGBT Power Module Using Novel Switching Cells," Ph.D. Dissertation, University of Tennessee, 2011.

* cited by examiner

LOW PROFILE, HIGHLY CONFIGURABLE, CURRENT SHARING PARALLELED WIDE BAND GAP POWER DEVICE POWER MODULE

CROSS-REFERENCE TO RELATED APPLICATIONS

This application claims priority to U.S. Provisional Patent Application Ser. No. 61/933,535, filed on Jan. 30, 2014 entitled LOW PROFILE, HIGHLY CONFIGURABLE POWER MODULE FOR EQUAL CURRENT SHARING OF MANY PARALLELED WIDE BAND GAP POWER DEVICES, and is a continuation of U.S. application Ser. No. 14/609,629 filed on Jan. 30, 2015 entitled LOW PROFILE, HIGHLY CONFIGURABLE, CURRENT SHARING PARALLELED WIDE BAND GAP POWER DEVICE POWER MODULE, now U.S. Pat. No. 9,426,883, which are hereby incorporated by reference in their entirety.

STATEMENT REGARDING FEDERALLY SPONSORED RESEARCH OR DEVELOPMENT

This invention was made with government support under grant FA8650-10-C-2124 awarded by the United States Air Force and grant DE-EE0006429 awarded by the Department of Energy. The United States government has certain rights in the invention.

STATEMENT REGARDING FEDERALLY SPONSORED RESEARCH OR DEVELOPMENT

Not Applicable.

REFERENCE TO A MICROFICHE APPENDIX

Not Applicable.

RESERVATION OF RIGHTS

A portion of the disclosure of this patent document contains material which is subject to intellectual property rights such as but not limited to copyright, trademark, and/or trade dress protection. The owner has no objection to the facsimile reproduction by anyone of the patent document or the patent disclosure as it appears in the Patent and Trademark Office patent files or records but otherwise reserves all rights whatsoever.

BACKGROUND OF THE DISCLOSURE

1. Field of the Disclosure

The present disclosure relates to improvements in wide band gap power modules. In particular, the disclosure relates to improvements in providing a configurable consistent power module design for multiple applications. The present disclosure relates to a parallel path power module allowing for current sharing at high switching frequencies.

2. Description of the Known Art

As will be appreciated by those skilled in the art, power modules are known in various forms. Patents with information of interest to power modules include: U.S. Pat. No. 7,687,903, issued to Son, et al. on Mar. 30, 2010 entitled Power module and method of fabricating the same; U.S. Pat. No. 7,786,486 issued to Casey, et al. on Aug. 31, 2010 entitled Double-sided package for power module; U.S. Pat. No. 8,018,056 issued to Hauenstein on Sep. 13, 2011 entitled Package for high power density devices; U.S. Pat. No. 8,368,210 issued to Hauenstein on Feb. 5, 2013 entitled Wafer scale package for high power devices; U.S. Pat. No. 6,307,755 issued to Williams, et al. on Oct. 23, 2001 entitled Surface mount semiconductor package, die-leadframe combination and leadframe therefore and method of mounting leadframes to surfaces of semiconductor die. Additional articles include: R. K. Ulrich and W. D. Brown, "Advanced Electronic Packaging," New Jersey: John Wiley & Sons, Inc., 2006, p. 203; and Shengnan Li, "Packaging Design of IGBT Power Module Using Novel Switching Cells," Ph.D. dissertation, University of Tennessee, 2011, http://trace.tennessee.edu/utk_graddiss/1205. Each of these patents and publications are hereby expressly incorporated by reference in their entirety.

Wide band gap power semiconductors, including Silicon Carbide, SiC, and Gallium

Nitride, GaN, offer numerous advantages over conventional Silicon, Si, based power electronic devices, including:
1. Reduced intrinsic carriers allowing for higher temperature operation
2. Increased carrier mobility
3. Higher electrical breakdown strength
4. Reduced on-resistance
5. Faster switching speeds
6. Increased thermal conductivity These benefits may allow designers to implement systems which are substantially smaller, more efficient, and more reliable that the current state-of-the-art systems. Higher temperature operation allows for the reduction of the cooling system required to remove waste heat. The potential also exists to switch from an active, i.e. forced air or liquid, cooling scheme to passive, natural convection, cooling, elimination of thermal shielding materials, and operation in extreme environments where traditional technology will fail. High frequency switching reduces switching losses and allows for a major reduction in the size of filtering elements in a power converter.

The promises of wide band gap power technology, however, are hindered by the power packaging necessarily to interconnect, protect, and integrate the devices into a power conversion system. Power packages for Si devices are generally designed to house one large device per switch position, often with a single antiparallel diode. Commercially available wide band gap devices, however, are not available as large, monolithic elements due to issues with wafer quality and yield. Accordingly, while the relative power density, per die area, for SiC is substantially higher than Si, in order to reach high currents, in the hundreds of amps, many SIC devices must be placed in parallel.

There is a fundamental issue with paralleling many devices in conventional packages which were not designed to effectively account for issues such as current sharing. This is particularly important due to the extremely high switching speeds of wide band gap devices, often hundreds of times faster than Si equivalents. Mismatches in inductances between the devices may cause uneven stresses and current overshoot during switching events. Additionally, the materials, attaches, and interfaces of established power module technology are not capable or reliable at the temperatures which wide band gap devices are operable.

From this, it may be seen that the prior art is very limited in its teaching and utilization, and an improved power module is needed to overcome these limitations.

SUMMARY OF THE DISCLOSURE

The present disclosure is directed to an improved power module using parallel power devices. In accordance with one exemplary embodiment of the present disclosure, a power module is provided with low inductance equalized current paths to many paralleled devices, allowing for even current sharing and clean switching events. The power module is capable of running at junction temperatures ranging from 200 to 250° C., depending on devices, operating conditions, etc. and may carry very high currents, 100 s of amps and greater. Chiefly, these enhancements fall into three categories: performance, function, and, usability. This technology is designed from the ground up to embrace the characteristics and challenges of wide band gap power devices. Features of the power module include the following highlights:

Matched footprint with industry standard 62 mm base plates.

Equalized power paths for effective paralleling of bare die power devices.

Large active area available for devices, 7.5 mm×71 mm per switch position.

Low module height, 10 mm.

Low inductance achieved with wide, low profile power contacts.

Short current path and large conductor cross section area for massive current carrying, >500 A.

Internal gate and source kelvin interconnection substrate with individual ballast resistors.

High reliability bolted connection of the internal gate & source kelvin interconnection substrate.

Standardized and configurable 1 mm, 2 mm, 0.1 in., and 0.05 in. pitch gate drive connectors.

Gate drive connectors on either left or right size of the module,

Option for internal temperature sensing RTD and associated input/output connectors.

Reduced unique part count to reduce system cost.

Reduced unique part count to increase modularity.

Configurable as half bridge, full bridge, common source, and common drain topologies.

Voltage creepage extenders incorporated into the plastic housing.

Lightweight through the use of low density materials, about 140 g in total.

Materials, attaches, and voltage blocking passivation capable of operating up to 250° C.

These and other objects and advantages of the present disclosure, along with features of novelty appurtenant thereto, will appear or become apparent by reviewing the following detailed description.

BRIEF DESCRIPTION OF THE SEVERAL VIEWS OF THE DRAWINGS

In the following drawings, which form a part of the specification and which are to be construed in conjunction therewith, and in which like reference numerals have been employed throughout wherever possible to indicate like parts in the various views.

DETAILED DESCRIPTION OF THE DISCLOSURE

Figure 1:
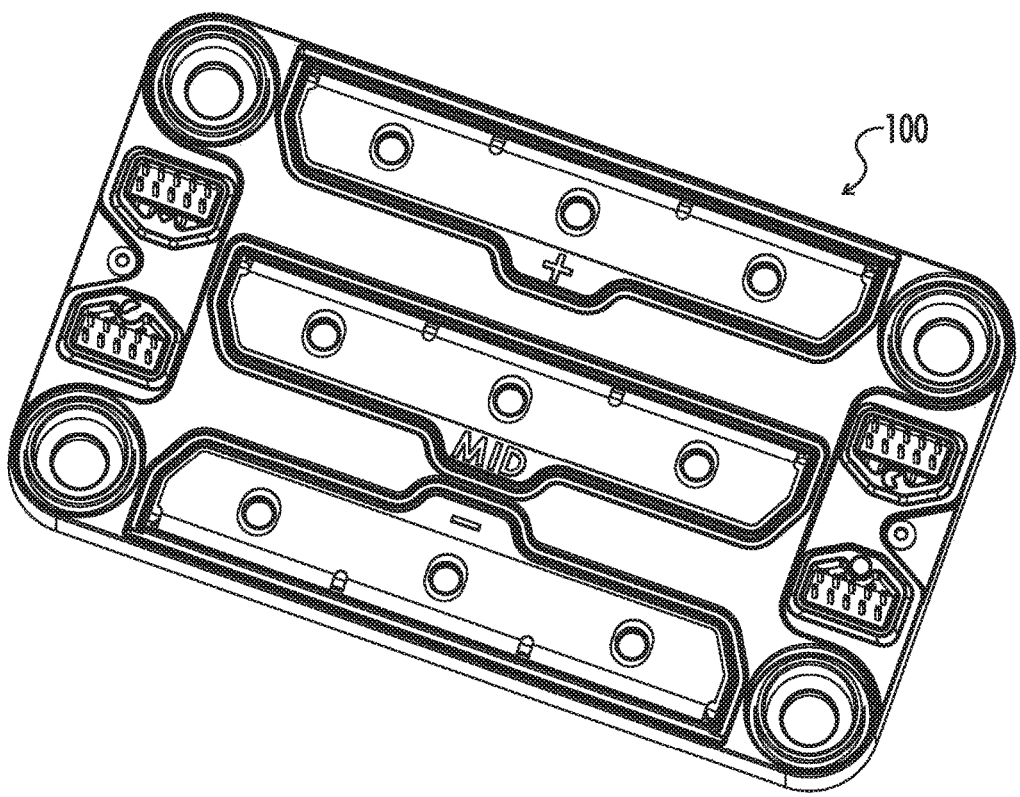
FIG. 1 shows a perspective view of the power module.

As shown in FIG. 1 of the drawings, one exemplary aspect of the present disclosure is generally shown as a power module 100. The power module 100 may be configurable in multiple useful power electronic topologies such as half bridge, full bridge, common source, and common drain, and can be configured in up to two separate channels. It is uniquely suited to take advantage of all wide band gap technology has to offer, while being flexible enough to meet the demands of many customer systems through custom configurations.

Figure 2:
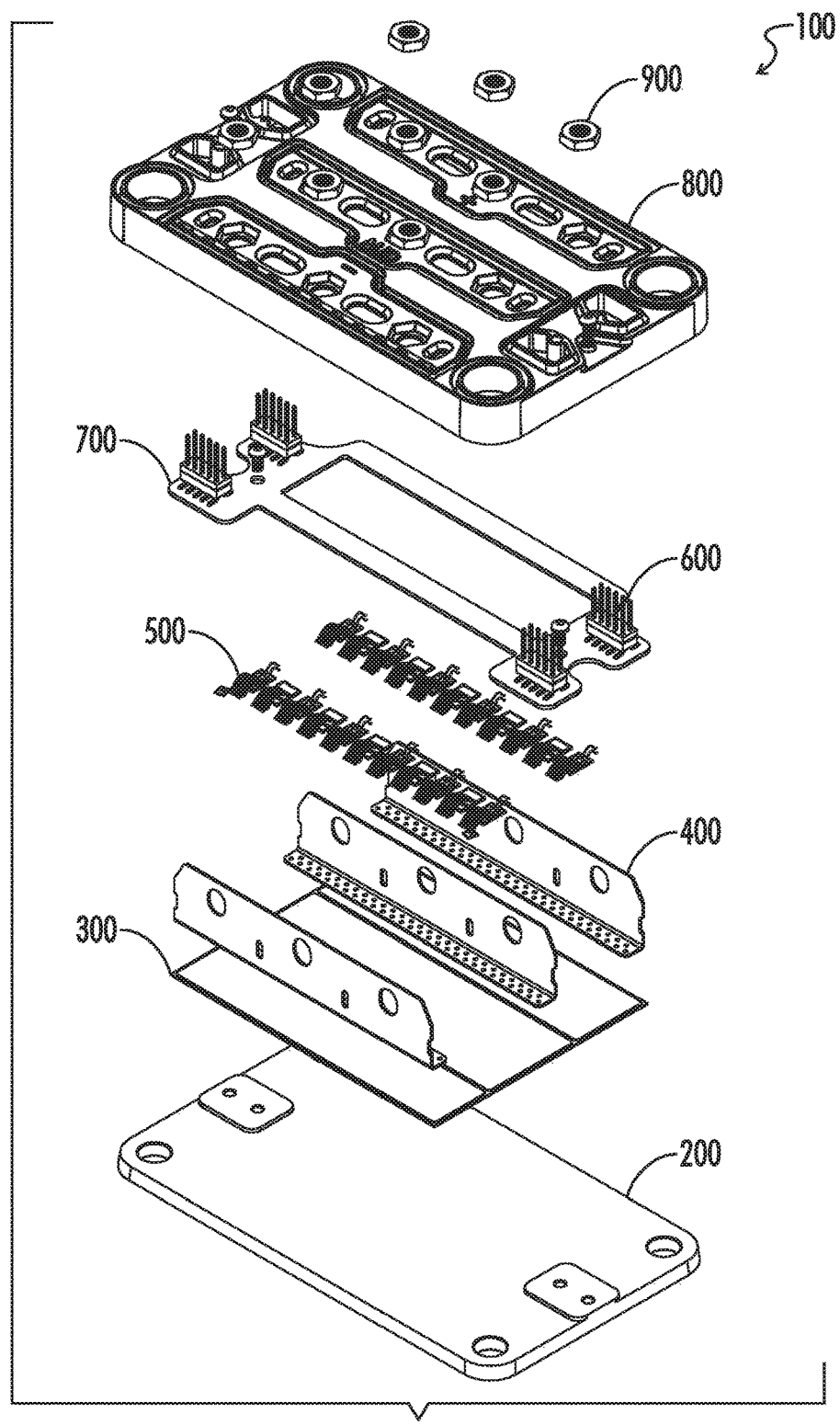
FIG. 2 shows an exploded view of the power module.

The power module 100 may include the primary elements outlined in FIG. 2. These elements may include the base plate 200, power substrate 300, power contacts 400, power devices 500, gate and source kelvin interconnection board 600, gate drive connectors 700, injection molded housing 800, and fasteners 900.

Specific focus was placed on using a footprint common in the power electronics industry, a 62 mm×107 mm base plate 200 with M6 mounting holes 48 mm×93 mm apart. This configuration may allow for customers with existing systems to evaluate these high performance modules without investing in a complete system redesign.

While the length and width of the module 100 may fit industry standards, the height of the module is 2× to 3 × thinner than contemporaries. It is 10 mm thick in total. This may dramatically reduce the module inductance and increase current carrying capability partially by utilizing lower path lengths. It may also provide a major source of system level volume savings in a power converter.

Figure 3:
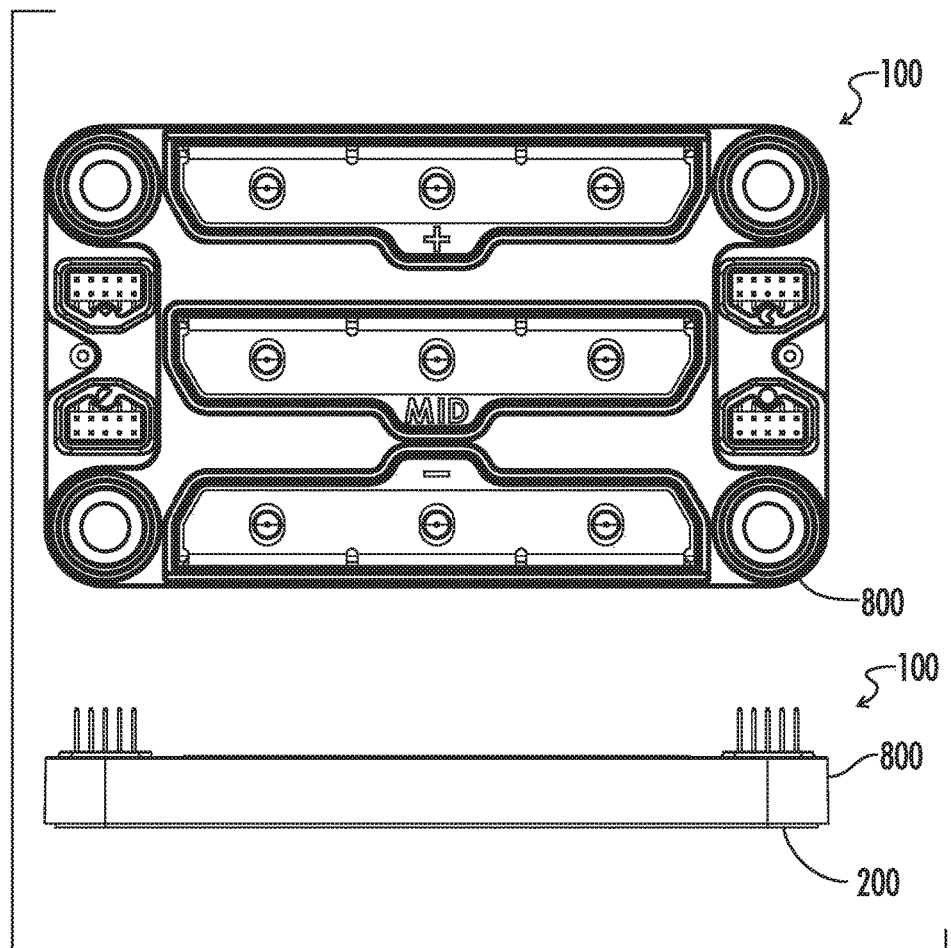
FIG. 3 shows a relative size to thickness comparison of the power module.

The comparison of top size to thickness dimensions of the power module 100 are presented in FIG. 3 in the top and side view comparison. The module 100 measures 65 mm×110 mm×10 mm. The plastic housing 800 may extend like a sheath over the base plate 200 for voltage isolation, which may account for the extra 3 mm on each side over the base plate 200 dimensions. It may have a volume of 71.5 cm$^3$ and weigh approximately 140 g.

The power module 100 may utilize 57.5 mm×73 mm, 42 cm$^2$, of the total footprint area for conduction. This represents an impressive 60% utilization solely for current carrying. The remaining area is used for mounting, 5%, gate drive connections, 5%, and plastic features including minimum wall thickness, voltage creepage extenders, and strengthening ribs, 30%.

Power Loop

Figure 4:
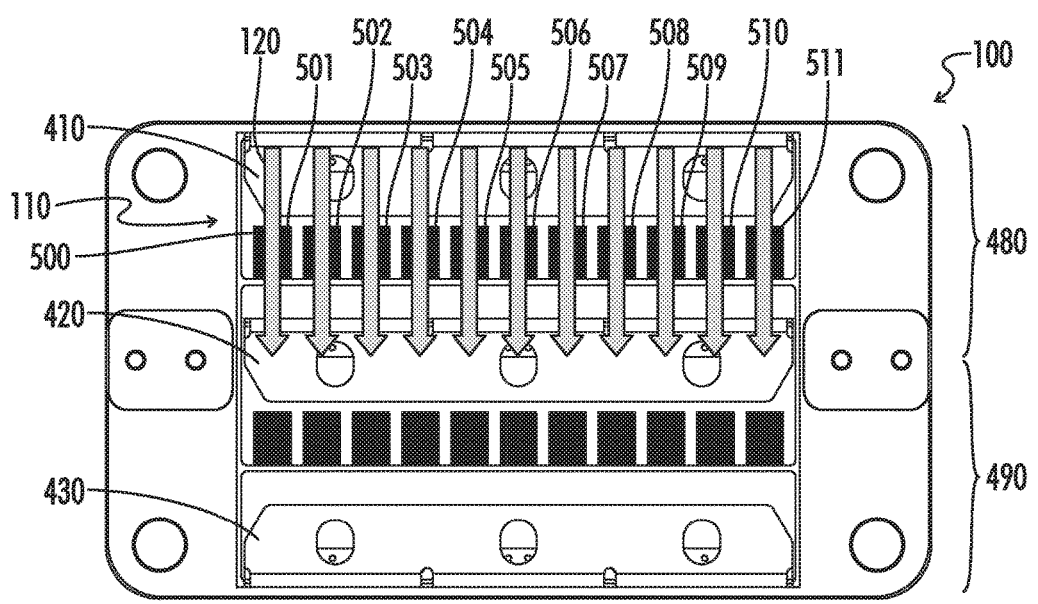
FIG. 4 shows the equalized current flow for multiple paralleled devices.

As noted by FIG. 4, the driving focus of the power module 100 power loop 110 may effectively parallel a large number of devices 500. Shown are a first power device 501, second power device 502, third power device 503, fourth power device 504, fifth power device 505, sixth power device 506, seventh power device 507, eight power device 508, ninth power device 509, tenth power device 510, and eleventh power device 511. The module 100 can either have two or four switch positions, depending on configuration, which is detailed later. FIG. 4 shows the upper position 480 and the lower position 490. This allows for a large amount of flexibility in the formation of each switch position, such that they may be tailored to specific applications without costly module 100 modifications. For example, the positions may have an equal number of diodes to the power switches 500, only a few diodes, or none at all. FIG. 4 is a representation of the power loop 110, depicting the even, shared current paths 120 for current traveling from the 20 "V+" terminal 410 to the "Mid" terminal 420, the V-terminal 430 is also shown that is used for devices 500 in the lower position 490. An additional benefit of this layout is that the even spacing of each device 500 may aid in the spreading of the heat sources across the module 100 instead of concentrating them in a few locations.

As displayed in FIG. 4, nearly the entire width of the power module 100 is utilized for the conduction of current. Many benefits would be lost if the module 100 was too tall. In the worst case, the length the current might travel through the power contact 410, 420, 430 might be longer than the path it travels once it reaches the substrates 300. Accordingly, the power contacts 400 were designed to have a relatively low height such that they contribute a negligible amount to the resistance and inductance of the system.

The relatively low height of the power contacts 400 was achieved by using a dual bending process. First, the power contacts 400 may be formed through either a metal stamping operation or by etching followed by forming in a press brake. The 90° bend at the base 450 may create an "L" shaped connector with a vertical body 460. The base 450 may be soldered down to the power substrates 300. The base 450 may be relatively thin in comparison to the overall shape. This may reduce the area consumed by this bond, allowing for more active device 500 area inside of the module 100. To improve adhesion of this thin bond, staggered holes called solder catches 454 may be etched or formed along the bonding surface 452 on the bottom of the base 450. Molten solder travels up the catches 454 through capillary action. Once solidified, the solder inside of the catches 454 substantially improves bond strength in many directions. An exemplary contact 400 with solder catches 454 is presented in FIG. 5.

Figure 5:
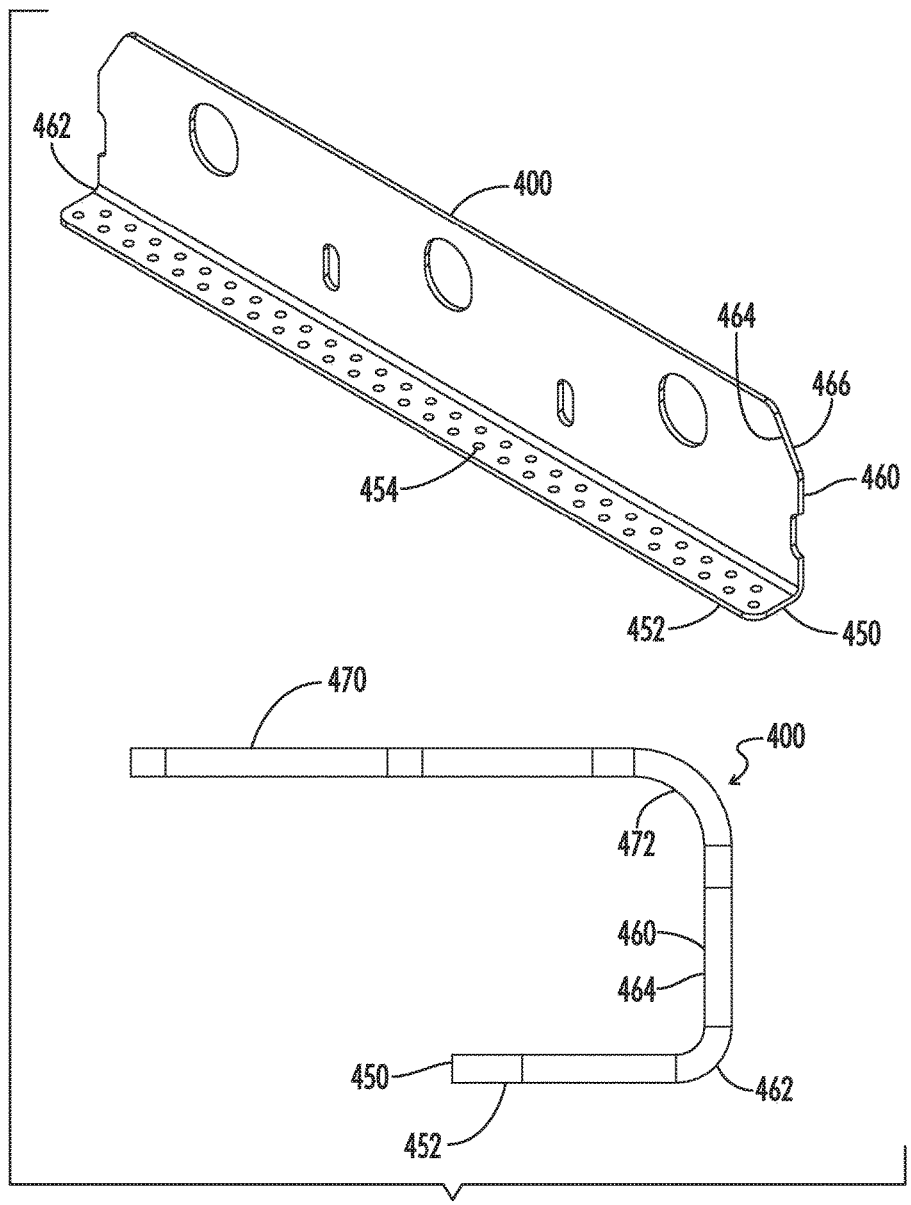
FIG. 5 shows the power contact design.
Figure 6:
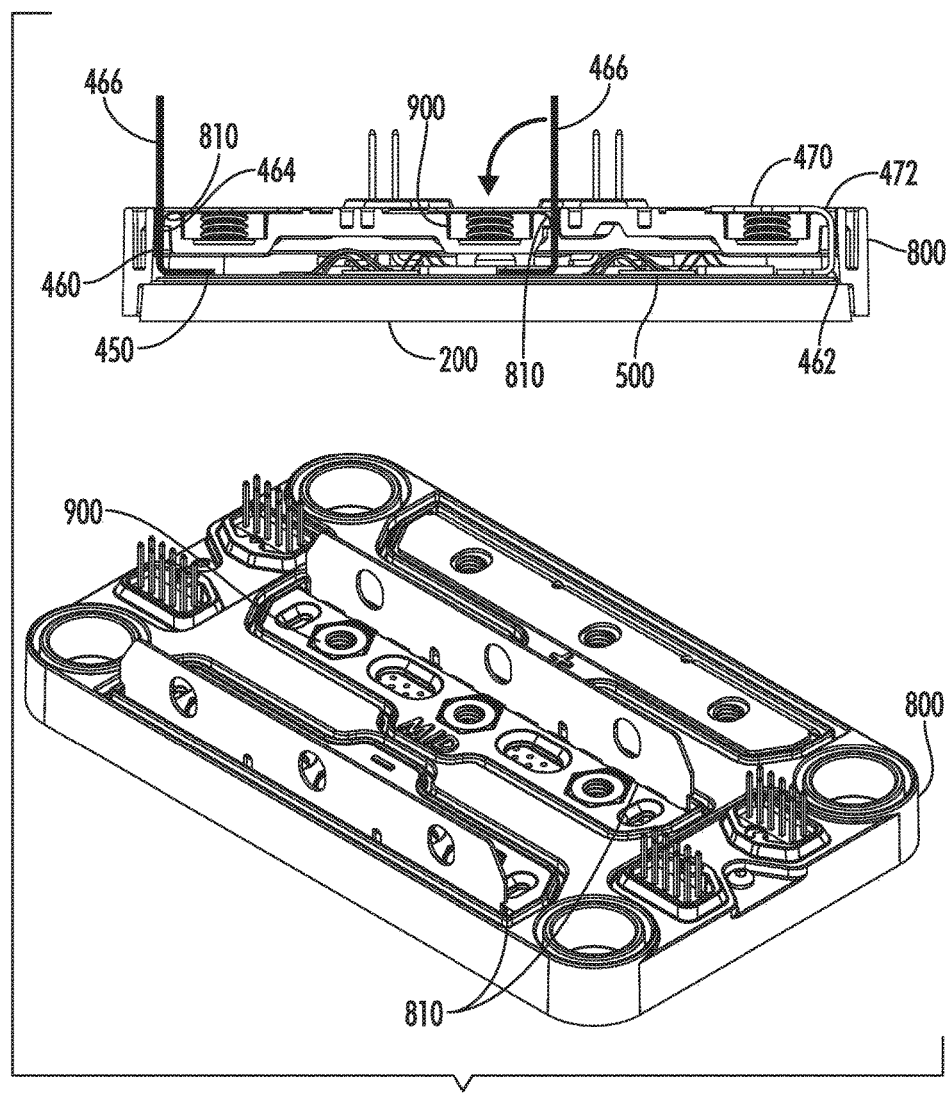
FIG. 6 shows the low profile power contact bending.

Also shown in FIG. 5 is how the "L" shaped contacts 400 may be bent a second time at the end of the fabrication process to form a contact top 470. Before bending, the vertical body 460 of the contact 400 allows for single piece plastic housing 800 to be dropped into place, as there may be no undercuts present. The radius of the second bend 472 may not be as tight as the first bend 462. This provides some tolerance in the process and is a smoother bending operation. The second radius 472 may be facilitated through a preformed radius 810 in the plastic housing 800, which, at this stage, is touching the leading edge 464 of the contacts 400. Specifically designed rotating bending hardware presses flatly on the opposite surface 466, folding the contacts 400 down over the captive fasteners 900. An illustration of the bending of the "L" shaped contacts into "C" shaped forms is pictured in FIG. 6.

Underneath the folded contacts 400 are low profile threaded fasteners 900 shown as nuts 900. These fasteners 900 are captured underneath the power contacts 400. They are otherwise loose. The captive fasteners 900 serve an important purpose. When the module 100 is bolted to buss bars, the loose fasteners 900 and the contacts 400 may be pulled upwards into the bussing, creating a quality electrical connection. If the fasteners 900 were affixed to the housing 800, they could act to pull the bussing down into the module 100 and could create a poor connection due to the stiffness of the buss bars.

Base Plate

The base plate 200 is a critical element of the module, providing mechanical support, heat spreading, and a means to effectively bolt down to a heat sink or cold plate. The material properties of the base plate 200 become increasingly important as the temperature of operation elevates. An effective example is found in the coefficient of thermal expansion, CTE, where materials in the assembly expand at different rates due to heat and may create large stresses in their interfaces.

The power module 100 utilizes a Metal Matrix Composite, MMC, material, which is a composite of a high conductivity metal, copper, aluminum, etc., and either a low CTE metal such as moly, beryllium, tungsten, or a nonmetal such as silicon carbide, beryllium oxide, graphite. These composite materials combine the best features of each contributing element, allowing for a high thermal conductivity with a CTE which is matched with the power substrate 300 to which it is attached.

Figure 7:
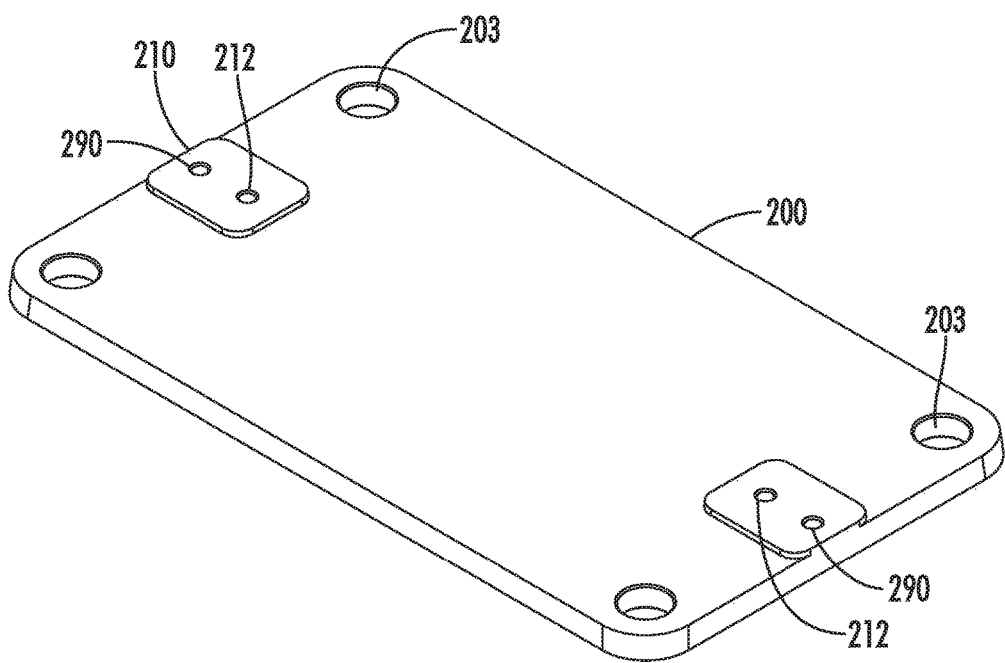
FIG. 7 shows the power module base plate.

FIG. 7 shows how the power module 100 base plate 200 was designed to match an industry standard 62 mm geometry, which has a set diameter and location for the mounting holes 203 in the corners. The thickness of the plate 200 was fine-tuned through the use of parametric finite element analysis of the CAD model. This was achieved by sweeping the thickness between pre-defined practical limits and measuring the thermal and mechanical responses. The material and thickness combinations that achieved the best thermal performance with a minimal mechanical deflection were selected. Additional features of the power module 100 plate may include machined or molded, depending on the MMC material, standoffs 210 with a threaded board hole 212, and housing hole 290 each. The standoff 210 provides a planar surface with the power substrate 300 such that the internal gate & source kelvin board 600 can be bolted down without bowing.

Gate Drive Loop

Independent electrical paths for each switch position are required to form gate and source kelvin connections, which are necessary for controlling the power switches. This may become difficult with the number of devices 500 in parallel, as ideally the gate and source kelvin routing would not interfere with the wide, equalized power paths.

Figure 8:
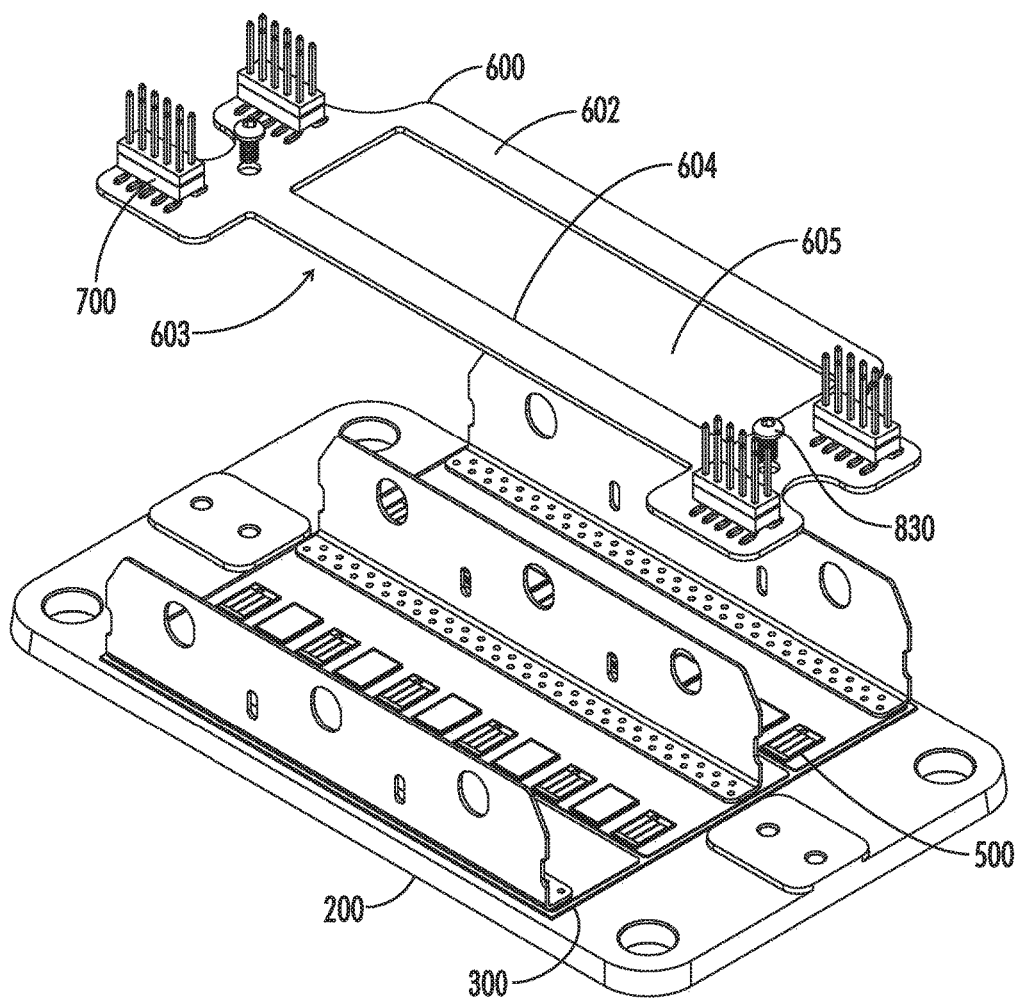
FIG. 8 shows the gate and source kelvin secondary substrate.
Figure 9:
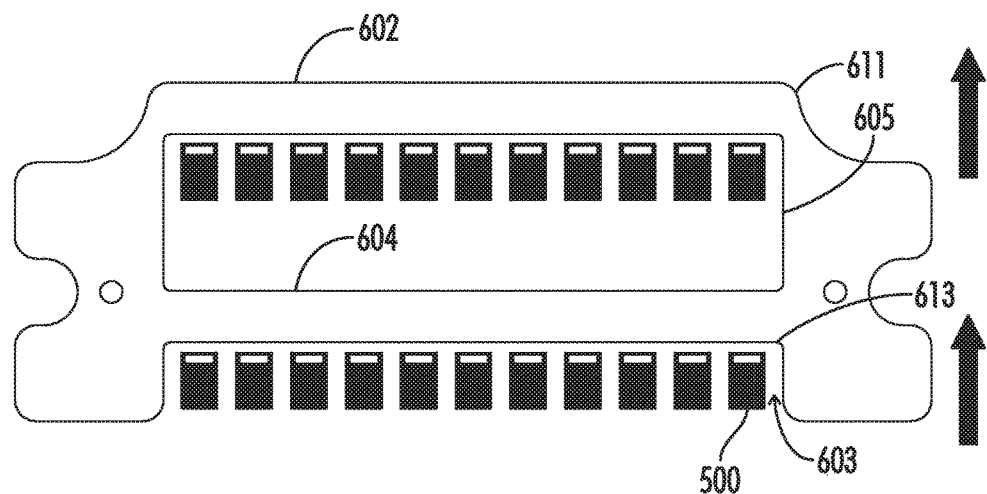
FIG. 9 shows the gate & source kelvin board half bridge arrangement.
Figure 10:
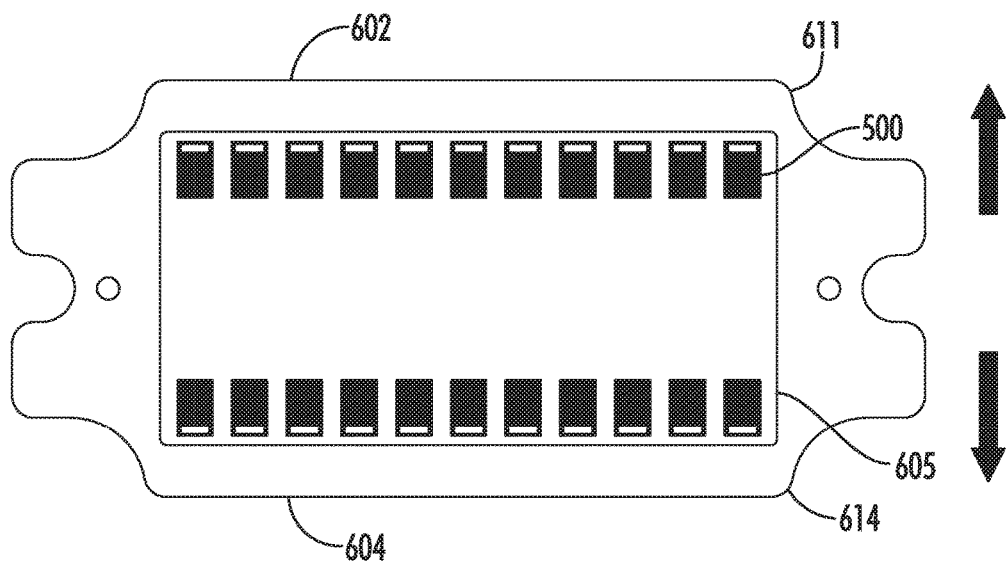
FIG. 10 shows the gate & source kelvin board common source arrangement.
Figure 11:
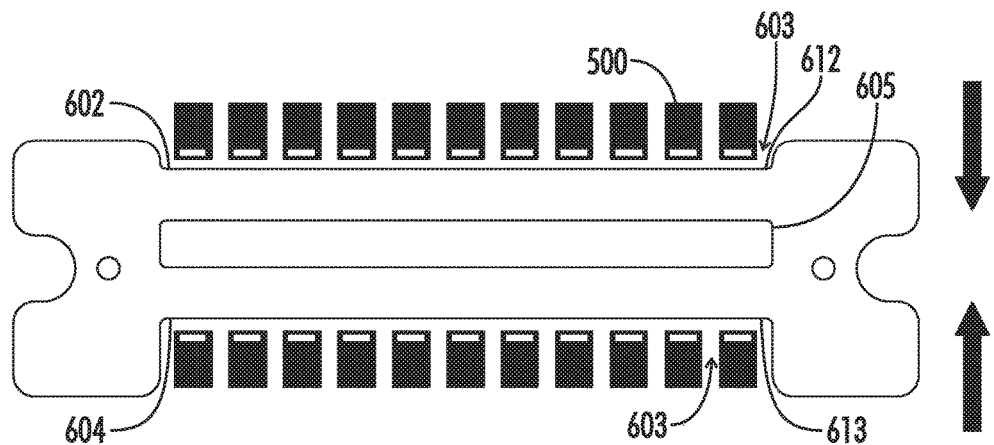
FIG. 11 shows the gate & source kelvin board common drain arrangement.

FIG. 8 shows how the power module 100 and its variations include a single piece secondary substrate 600 which is placed over the power substrate 300 and then bolted down to the base plate 200. As shown in FIGS. 8 through 11, the gate and source kelvin substrate 600 has two interconnection channels 602, 604 which may be located in one of four positions top or first 611, upper middle or second 612, lower middle or third 613, and bottom or fourth 614 to define die apertures such as an external die aperture 603 or middle die aperture 605 to allow for a multitude of module 100 configurations. Essentially, the relative layout of each interconnection channel 602, 604 may be the same; however, the location and direction may be adapted to match the associated die aperture 603, 605 and die 500 placement and rotation to match each topology. This is illustrated in FIG. 9, FIG. 10, and FIG. 11 with the arrows indicating the gate direction for a half bridge, common source, and common drain topology, respectively. Each of those may consist of a single or dual channel arrangement, depending on the layout of the power substrate 300 and the format of the power contacts 400 and housing 800.

Figure 12:
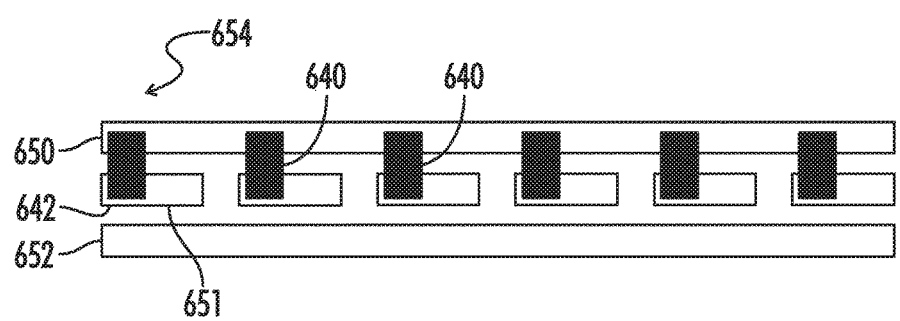
FIG. 12 shows the single layer modular gate and source kelvin example layout.

As shown in FIG. 12, to aid in paralleling, individual ballast resistors 640 may be included on the interconnection board 600. While there are many different layouts these boards can utilize such as parallel planes, clock tree distribution, etc., one of the more effective is a low cost single layer modular arrangement with many bonding locations 642. As shown, a gate track 650 and source track 652 go across the length of the interconnection channels 654. Source wire bonds are formed directly on the source track 652. Each gate is bonded to individual gate pads 651 which are connected to the gate track through resistors 640. The values of the resistors 640 are device and application dependent and will vary between module 100 configurations.

Power Substrate

Figure 13:
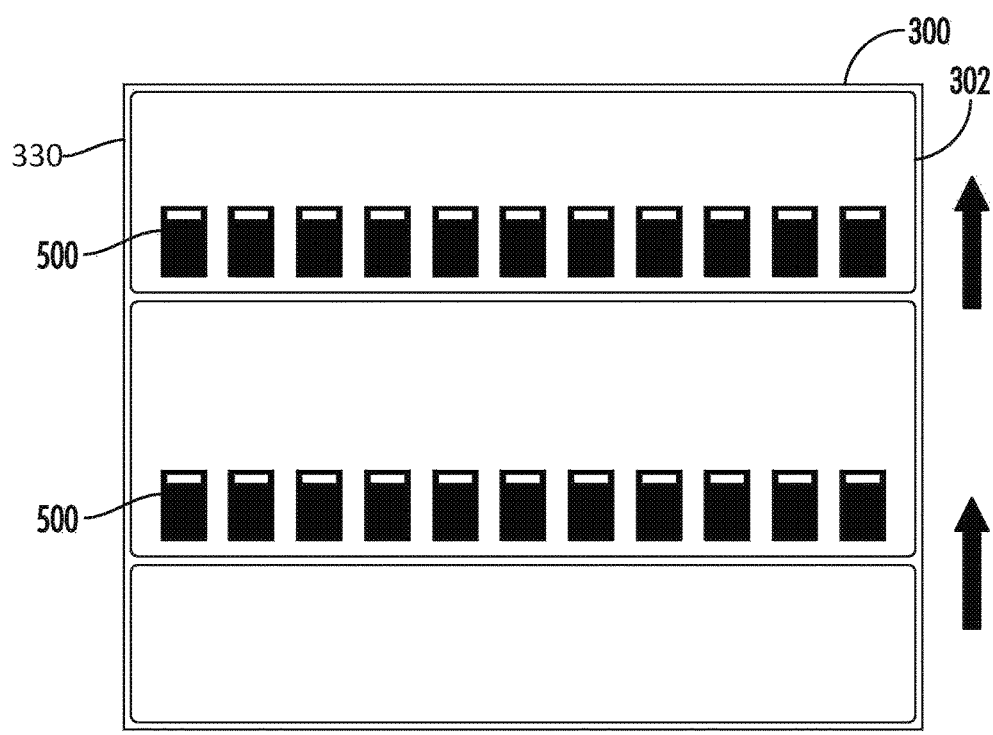
FIG. 13 shows the power substrate half bridge arrangement.
Figure 14:
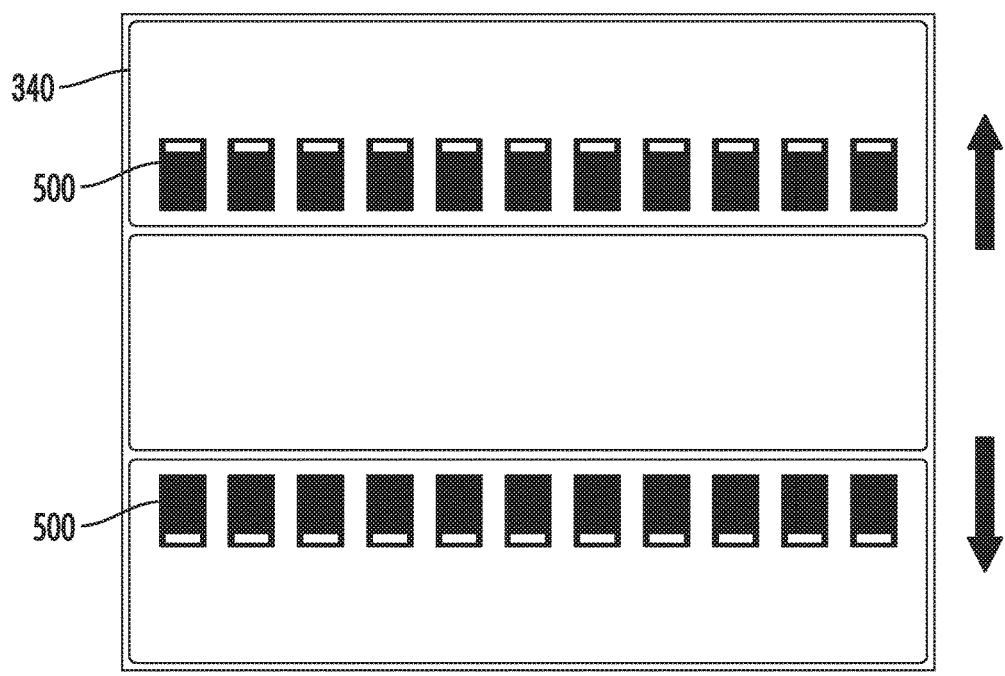
FIG. 14 shows the power substrate common source arrangement.
Figure 15:
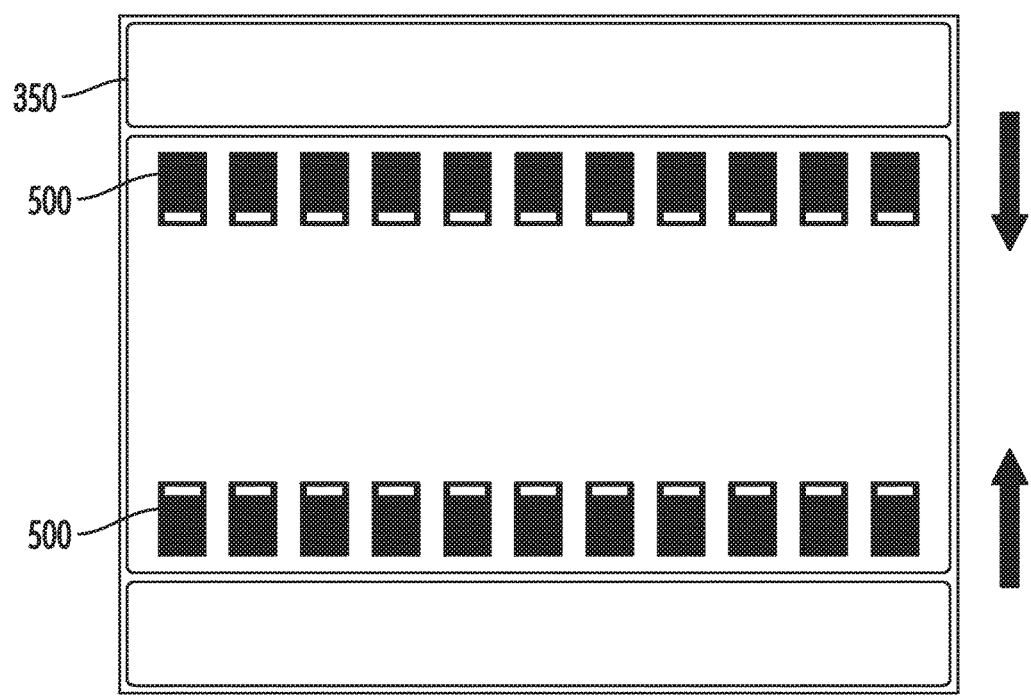
FIG. 15 shows the power substrate common drain arrangement.

FIG. 13 shows the power substrate 300 which may be a metal-ceramic-metal layered structure designed to handle very high currents and voltages with the arrows again showing the gate direction to be matched with the boards 600. Metals may be copper or aluminum at varying thicknesses, while the ceramic materials are typically alumina, Al2O3, aluminum nitride, AlN, or silicon nitride, Si3N4. The metal layers 302 may be etched into topology specific patterns 330, 340 350 as illustrated in FIG. 13 for a half bridge substrate 330, FIG. 14 for a common source substrate 340, and FIG. 15 for a common drain substrate 350 showing the upper and lower die 500 positions for each configuration. Also note that each of these layouts may be split into a dual channel arrangement by etching a line down the center of the substrates 300. They may also be split into individual substrates per channel if desired. This may be useful for more harsh environments as the smaller substrates will experience less stress.

Housing

Figure 16:
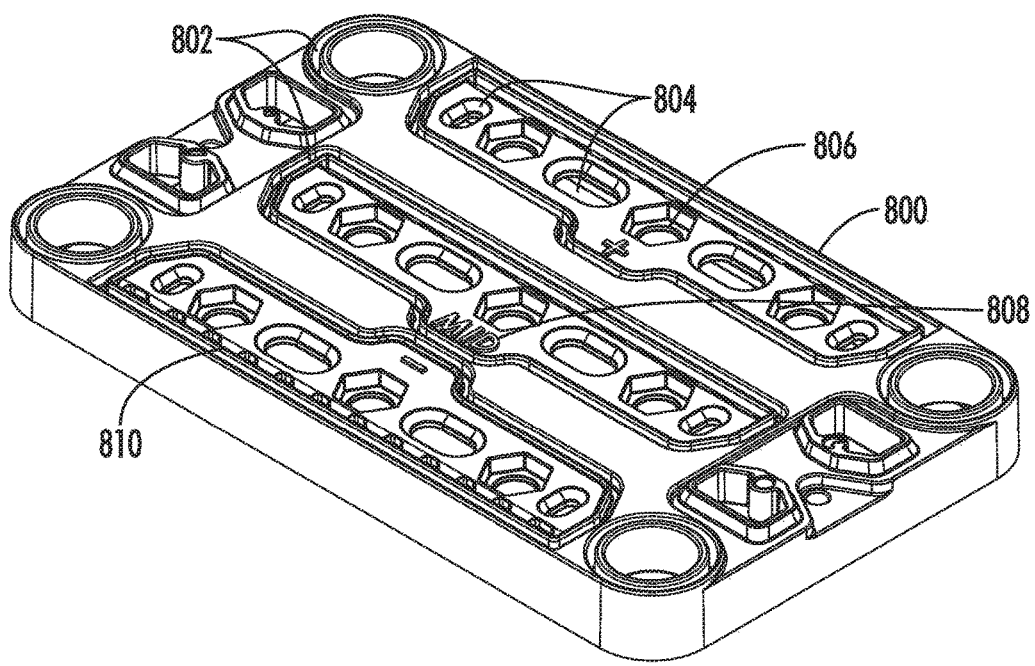
FIG. 16 shows the high temperature plastic housing topside features.
Figure 17:
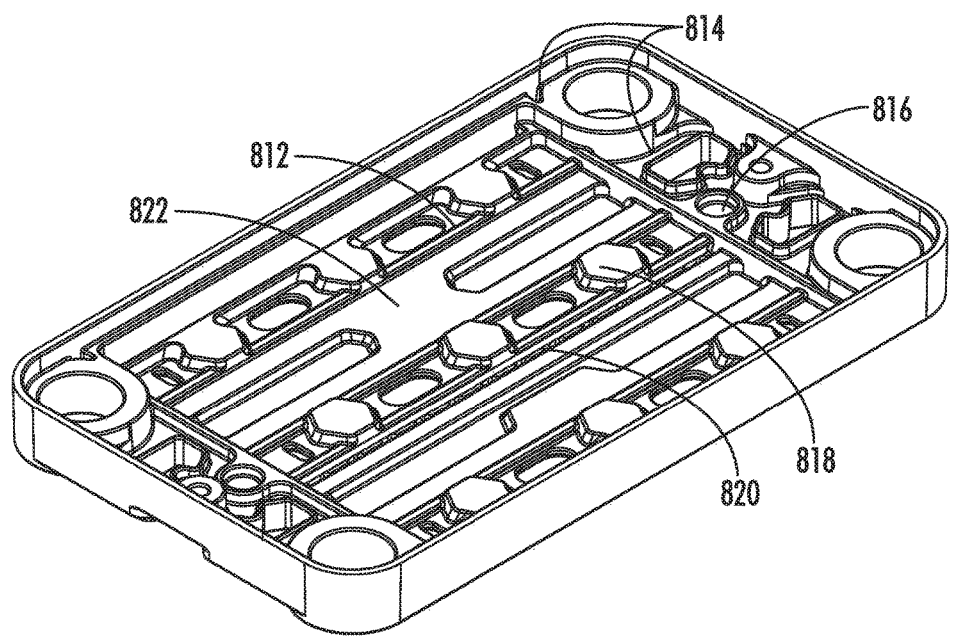
FIG. 17 shows the high temperature plastic housing backside features.

The housing 800 may be formed in an injection molding process with reinforced high temperature plastic. The housing 800 may serve many functions in addition to being a protective barrier to the sensitive semiconductors 500. These functions may include voltage blocking, mechanical support for the captive fasteners 900, guides for the power contact bending process, entry zones for gel passivation, vents for the gel passivation process, and self-strengthening internal ribs 812. Many of these features are depicted in FIG. 16 and FIG. 17. High aspect ratio trenches may be placed around the periphery of the power contacts 400 to increase the surface distance between exposed metal contacts, increasing voltage blocking capability.

FIG. 16 shows the high temperature plastic housing topside features including the creepage extenders 802, the passivation entries and vents 804, the captive fasteners apertures 806, the labeling area 808, and the power contact pinch and radius 810. FIG. 17 shows the backside features including the strengthening ribs 812, the thick bolt hole core sections 814, the bolt head clearance recess 816, the bottoms of the fastener insets 818, the power contact entryways 820, and the wire bond clearance apertures 822.

Figure 18:
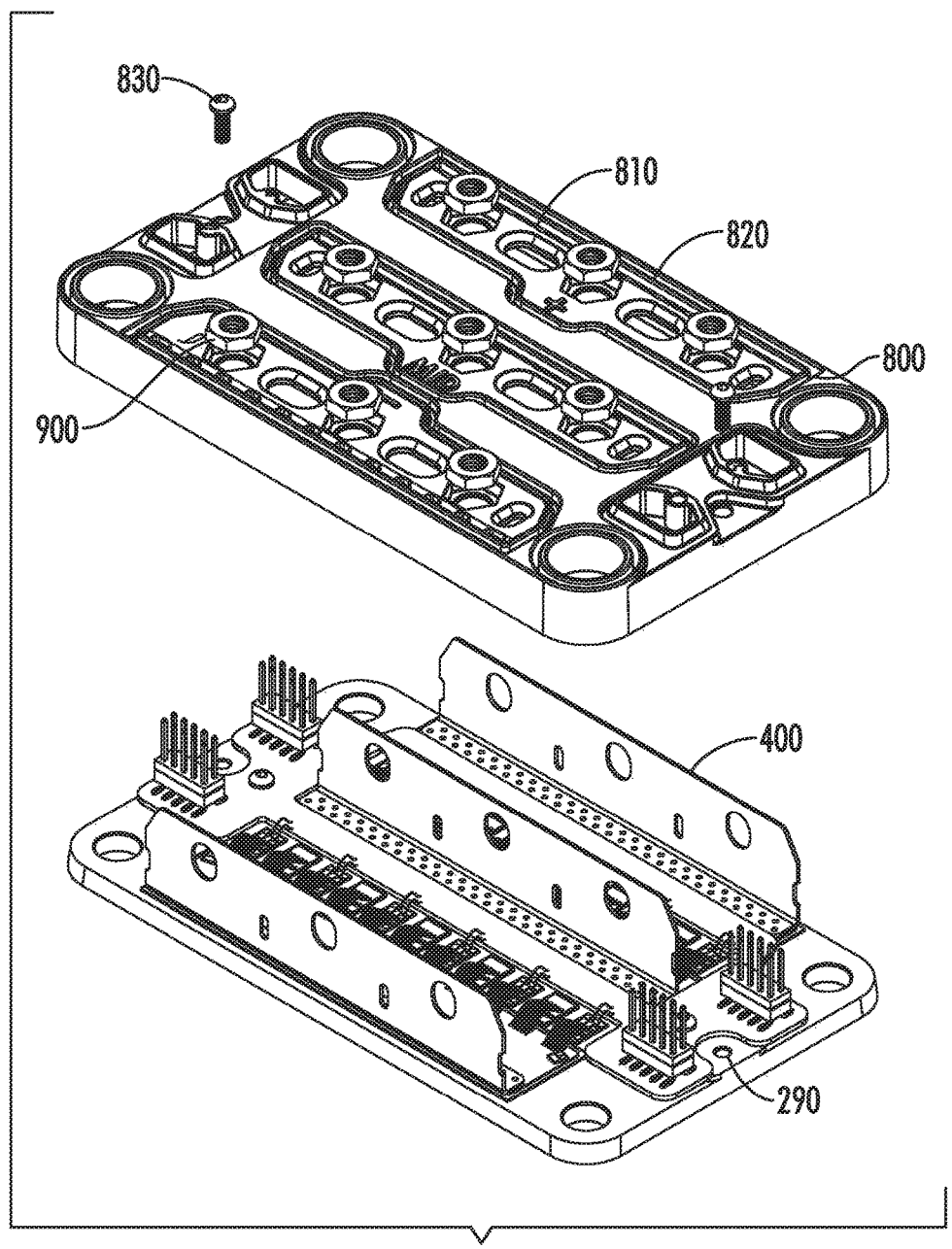
FIG. 18 shows the housing attached to power module assembly.
Figure 19:
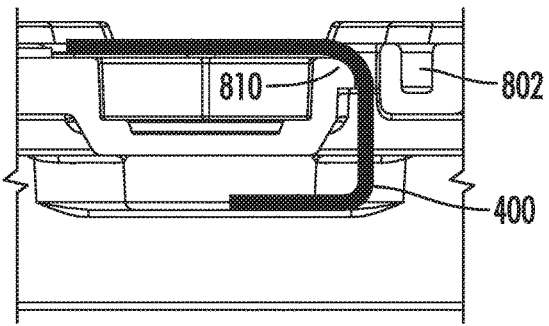
FIG. 19 shows the power contact guides.

FIG. 18 shows how the housing 800 slides over the electronic sub assembly to form the top of the module 100, with the power contacts 400 routed through the narrow openings 820. The housing 800 may be bolted 830 at two points to threaded holes 290 on the base plate 200. At this stage the gel passivation material is injected into the module 100 and fully cured. Multiple openings and vents 804 assist this assembly step. The slices 820 in the housing 800 for the power contacts 400 have drafted "guides" to aid this process, and a rounded fillet 810 on top to aid in the bending procedure. These are illustrated in FIG. 19.

Configurability

As discussed earlier n this document, the power module 100 may be configurable in a variety of useful power electronic topologies. These topologies may include half bridge, common source, and common drain. Splitting the channels, through layout changes in the power substrate 300 and gate and source kelvin board 600 and alterations to the power contacts 400 and housing 800, allows three more configurations, including a full bridge, common source dual channel, and common drain dual channel.

Figure 20:
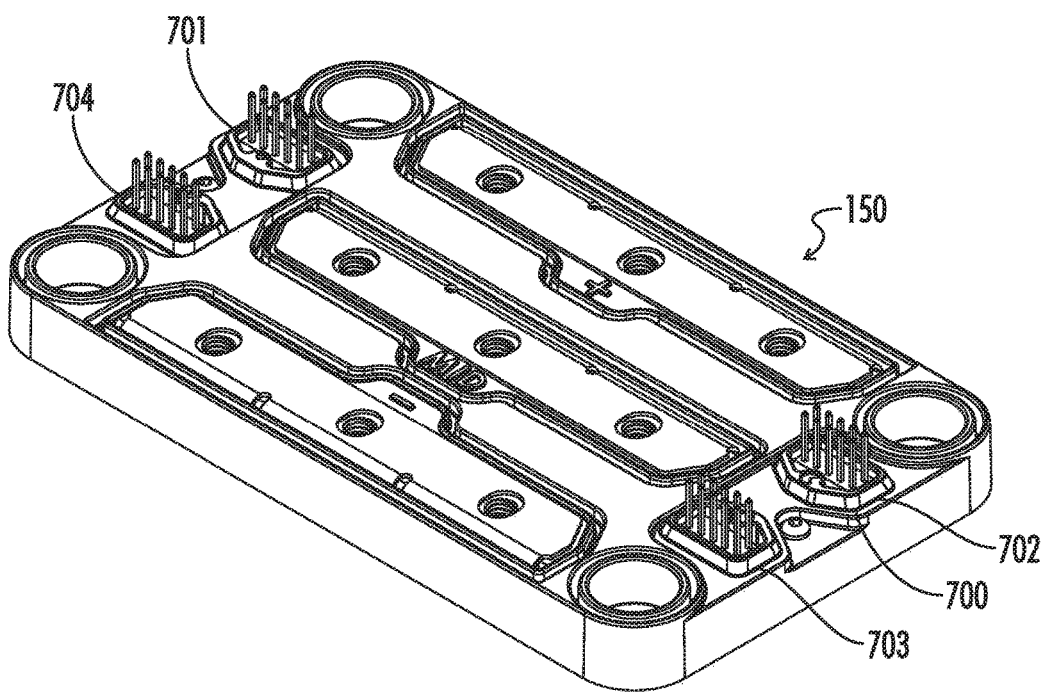
FIG. 20 shows the half bridge, single channel common source or drain module.
Figure 21:
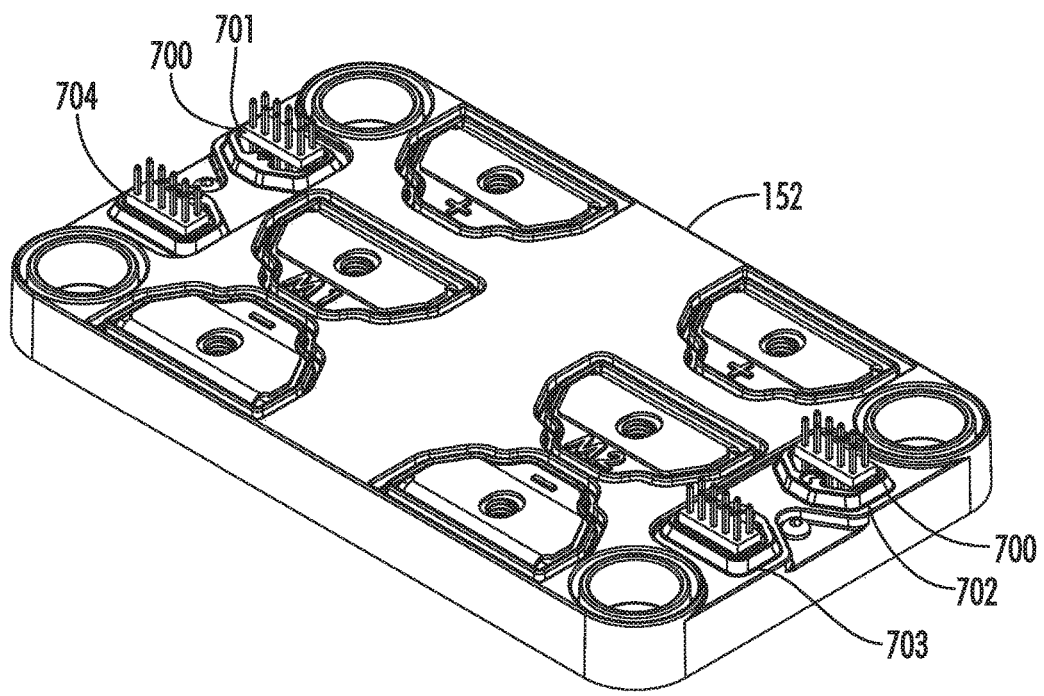
FIG. 21 shows the full bridge, dual channel common source or drain module.

FIG. 20 displays the first external configuration 150 for half bridge, single channel common source, and single channel common drain configurations. There may be four locations 701, 702, 703, 704 for the gate driver connections 700, two on each side. Either or both sides may be used for this purpose. For the dual channel arrangement 152, shown in FIG. 21, the power contacts 400 are split and provide two fully isolated channels. Gate drive connectors 700 on both sides are now required. This arrangement may be used for a full bridge, dual channel common source, and dual channel common drain topologies.

Figure 22:
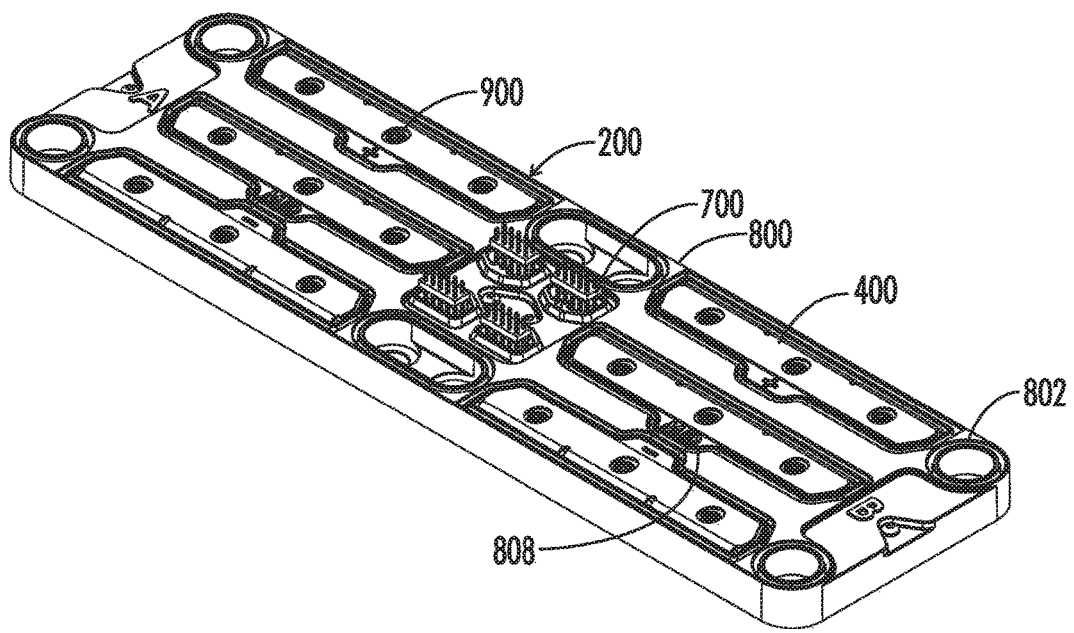
FIG. 22 shows the extended single housing side-by-side module configuration.

For higher currents and for customers who desire a single module, a larger side-by-side arrangement of a dual power module 200 may be fabricated from two modules built side by side into a single housing 800. This is illustrated in FIG. 22.

Reference numerals used throughout the detailed description and the drawings correspond to the following elements:
power module 100
power loop 110
shared current paths 120
first external configuration 150
dual channel arrangement 152
base plate 200
mounting holes 203
standoffs 210
threaded holes 212
threaded holes 290
power substrate 300
metal layers 302
first topology pattern half bridge substrate 330
second topology pattern common source substrate 340
third topology pattern common drain substrate 350
power contacts 400
first power contact 410
second power contact 420
third power contact 430
base 450
bonding surface 452 solder catches 454
vertical body 460
first bend 462
leading edge 464
opposite surface 466
contact top 470
second bend 472
upper position 480
lower position 490
power devices 500
first paralleled power device 501
second paralleled power device 502
third paralleled power device 503
fourth paralleled power device 504
fifth paralleled power device 505
sixth paralleled power device 506
seventh paralleled power device 507
eight paralleled power device 508
ninth paralleled power device 509
tenth paralleled power device 510
eleventh paralleled power device 511
gate & source kelvin interconnection board 600
first interconnection channel 602
external die aperture 603
second interconnection channel 604
internal die aperture 605
first interconnection position 611
second interconnection position 612
third interconnection position 613
fourth interconnection position 614
individual ballast resistors 640
bonding locations 642
gate track 650
gate pads 651
source track 652
interconnection channels 654
gate drive connectors 700
first gate driver connection location 701
second gate driver connection location 702
third gate driver connection location 703
fourth gate driver connection location 704
housing 800
creepage extenders 802
passivation entries and vents 804
captive fasteners apertures 806
labeling area 808
power contact pinch and radius 810
strengthening ribs 812
bolt hole core sections 814
bolt head clearance recess 816
fastener insets 818
power contact entryway slices 820
wire bond clearance apertures 822
bolt 830
fasteners 900

From the foregoing, it will be seen that this disclosure well adapted to obtain all the ends and objects herein set forth, together with other advantages which are inherent to the structure. It will also be understood that certain features and sub-combinations are of utility and may be employed without reference to other features and sub-combinations. This is contemplated by and is within the scope of the claims. Many possible embodiments may be made of the disclosure without departing from the scope thereof. Therefore, it is to be understood that all matter herein set forth or shown in the accompanying drawings is to be interpreted as illustrative and not in a limiting sense.

When interpreting the claims of this application, method claims may be recognized by the explicit use of the word 'method' in the preamble of the claims and the use of the 'ing' tense of the active word. Method claims should not be interpreted to have particular steps in a particular order unless the claim element specifically refers to a previous element, a previous action, or the result of a previous action. Apparatus claims may be recognized by the use of the word 'apparatus' in the preamble of the claim and should not be interpreted to have 'means plus function language' unless the word 'means' is specifically used in the claim element. The words 'defining,' 'having,' or 'including' should be interpreted as open ended claim language that allows additional elements or structures. Finally, where the claims recite "a" or "a first" element of the equivalent thereof, such claims should be understood to include incorporation of one or more e such elements, neither equiring nor excluding two or more such elements.

What is claimed is:

1. A power module apparatus, comprising:
    a base plate defining a topology pattern;
    a power substrate positioned above the base plate;
    at least two power contacts, each of the at least two power contacts electrically connected to the power substrate; and
    a housing secured to the power substrate,
    wherein the power module comprises a height that is less than 20 mm.

2. The power module according to claim 1, wherein the height is at least three times thinner than prior art power modules.

3. The power module according to claim 1 wherein the height is 10 mm or less.

4. The power module according to claim 1 further comprising solder catches arranged on the at least two power contacts,
    wherein the at least two power contacts are soldered to the power substrate through the solder catches.

5. The power module according to claim 1 further comprising:
    a gate and source board provided above the power substrate;
    gate drive connectors electrically connected to the gate and source board;
    at least two parallel shared current path power devices electrically connected to the at least two power contacts; and
    the gate drive connectors and the at least two power contacts are configured to extend through the housing.

6. The power module according to claim 5 wherein the gate and source board comprises a plurality of interconnection channels being configured in one of a plurality of positions to provide a plurality of power module configurations.

7. The power module according to claim 1 wherein the power module is configured to implement at least one of a plurality of power electronic topologies including at least one of the following: a half bridge, a common source, and a common drain.

8. The power module according to claim 1
    wherein the power module is configured to receive one of a plurality of different gate and source board configurations; and
    wherein each one of the plurality of different gate and source board configurations comprise a different configuration of a plurality of interconnection channels.

9. The power module according to claim 1 wherein the power module is configured to utilize up to 60% of a total footprint area for conduction of power.

10. The power module according to claim 1 further comprising a plurality of power devices,
wherein the plurality of power devices are evenly spaced across the power substrate.

11. A power module apparatus, comprising:
a base plate defining a topology pattern;
a power substrate positioned above the base plate;
at least two power contacts, each of the at least two power contacts electrically connected to the power substrate;
solder catches arranged on the at least two power contacts; and
a housing secured to the power substrate.

12. The power module according to claim 11 wherein the power module comprises a height that is at least two times thinner than prior art power modules.

13. The power module according to claim 11 wherein the at least two power contacts are soldered to the power substrate through the solder catches.

14. The power module according to claim 11 further comprising:
a gate and source board provided above the power substrate;
gate drive connectors electrically connected to the gate and source board;
at least two parallel shared current path power devices electrically connected to the at least two power contacts; and
the gate drive connectors and the at least two power contacts are configured to extend through the housing.

15. The power module according to claim 11 wherein the power module is configured to implement at least one of a plurality of power electronic topologies including at least one of the following: a half bridge, a common source, and a common drain.

16. The power module according to claim 11
wherein the power module is configured to receive one of a plurality of different gate and source board configurations; and
wherein each one of the plurality of different gate and source board configurations comprise a different configuration of a plurality of interconnection channels.

17. The power module according to claim 11 wherein the power module is configured to utilize up to 60% of a total footprint area for conduction of power.

18. The power module according to claim 11 further comprising a plurality of power devices,
wherein the plurality of power devices are evenly spaced across the power substrate.

19. A power module apparatus, comprising:
a base plate defining a topology pattern;
a power substrate positioned above the base plate;
at least two power contacts, each of the at least two power contacts electrically connected to the power substrate; and
a housing secured to the power substrate,
wherein each of the at least two power contacts comprise a bonding surface, a body portion connected to the bonding surface through a first bent portion, and a contact connected to the bonding surface through a second bent portion.

20. The power module according to claim 19 wherein the power module comprises a height that is at least two times thinner than prior art power modules.

21. The power module according to claim 19 wherein the power module comprises a height of 10 mm or less.

22. The power module according to claim 19 further comprising:
a gate and source board provided above the power substrate;
gate drive connectors electrically connected to the gate and source board;
at least two parallel shared current path power devices electrically connected to the at least two power contacts; and
the gate drive connectors and the at least two power contacts are configured to extend through the housing.

23. The power module according to claim 19
wherein the power module is configured to receive one of a plurality of different gate and source board configurations; and
wherein each one of the plurality of different gate and source board configurations comprise a different configuration of a plurality of interconnection channels.

24. The power module according to claim 19 wherein the power module is configured to utilize up to 60% of a total footprint area for conduction of power.

25. The power module according to claim 19 further comprising a plurality of power devices,
wherein the plurality of power devices are evenly spaced across the power substrate.

26. A power module apparatus, comprising:
a base plate defining a topology pattern;
a power substrate provided above the base plate;
at least two power contacts electrically connecting to the power substrate; and
a housing secured to the power substrate,
wherein the power module comprises a height of 10 mm or less.

27. The power module according to claim 26 wherein the height is at least two times thinner than prior art power modules.

28. The power module according to claim 26 further comprising:
a gate and source board provided above the power substrate;
gate drive connectors electrically connected to the gate and source board; and
at least two parallel shared current path power devices electrically connected to the at least two power contacts,
wherein the gate drive connectors and the at least two power contacts are configured to extend through the housing.

* * * * *